(12) United States Patent
Sakata

(10) Patent No.: US 11,764,803 B2
(45) Date of Patent: Sep. 19, 2023

(54) D/A CONVERSION DEVICE, METHOD, STORAGE MEDIUM, ELECTRONIC MUSICAL INSTRUMENT, AND INFORMATION PROCESSING APPARATUS

(71) Applicant: CASIO COMPUTER CO., LTD., Tokyo (JP)

(72) Inventor: Goro Sakata, Hamura (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 17/706,012

(22) Filed: Mar. 28, 2022

(65) Prior Publication Data

US 2022/0224351 A1 Jul. 14, 2022

Related U.S. Application Data

(62) Division of application No. 16/477,504, filed as application No. PCT/JP2018/002036 on Jan. 16, 2018, now Pat. No. 11,316,529.

(30) Foreign Application Priority Data

Jan. 16, 2017 (JP) .............................. JP2017-005427

(51) Int. Cl.
*H03M 3/00* (2006.01)
*G10H 1/34* (2006.01)
*G10H 7/08* (2006.01)

(52) U.S. Cl.
CPC ............ *H03M 3/506* (2013.01); *G10H 1/344* (2013.01); *G10H 7/08* (2013.01); *H03M 3/42* (2013.01)

(58) Field of Classification Search
CPC ........ H03M 3/506; H03M 3/42; G10H 1/344; G10H 7/08
See application file for complete search history.

(56) References Cited

U.S. PATENT DOCUMENTS 5,815,102 A 9/1998 Melanson
6,373,417 B1 4/2002 Melanson
(Continued)

FOREIGN PATENT DOCUMENTS

JP 2015185900 A 10/2015

OTHER PUBLICATIONS

International Search Report dated May 28, 2018 issued in International Application No. PCT/JP2018/002036.
(Continued)

*Primary Examiner* — Jianchun Qin
(74) *Attorney, Agent, or Firm* — Holtz, Holtz & Volek PC

(57) ABSTRACT

A digital-to-analog conversion device which performs integration processing for integrating a difference between an input signal and a first return signal generated based on the input signal, and outputting an integration result, first quantization processing for quantizing the integration result, and outputting a first quantization signal, first return signal output processing for outputting the first return signal by adding to the first quantization signal a correction value delay signal acquired by a correction value signal outputted based on the integration result being delayed, and output processing for outputting output signals including a signal whose pulse width is asymmetrical to center of a processing period, based on the first quantization signal, in which the correction value signal includes a signal indicating a correction value for correcting a difference between a center of the pulse width asymmetrical to the center of the processing period and the center of the processing period.

9 Claims, 11 Drawing Sheets

(56) References Cited

U.S. PATENT DOCUMENTS

| | | |
|---|---|---|
| 6,710,729 B1 * | 3/2004 | Chen .................. H03M 3/3287 |
| | | 341/131 |
| 7,209,064 B1 | 4/2007 | Gaboriau et al. |
| 7,327,296 B1 * | 2/2008 | Gaboriau .............. H03M 3/358 |
| | | 341/170 |
| 7,453,387 B2 | 11/2008 | Lee |
| 9,343,052 B2 | 5/2016 | Sakata |
| 9,455,737 B1 | 9/2016 | Rajaee et al. |
| 2007/0176810 A1 | 8/2007 | Lee |
| 2015/0270848 A1 | 9/2015 | Sakata |

OTHER PUBLICATIONS

Japanese Office Action (and English language translation thereof) dated Nov. 17, 2020 issued in Japanese Application No. 2017-005427.

Written Opinion of the International Searching Authority (ISA) dated Jul. 19, 2018 issued in International Application No. PCT/JP2018/002036.

Goldberg, et al., "Noise Shaping and Pulse-Width MOduclation for an All-Digital Audio Power Amplifier", JAES, vol. 38, No. 6, Jun. 1, 1991, pp. 449-460, XP055474834.

\* cited by examiner

FIG. 6

| TARGET QUANTIZA-TION VALUE | FIRST QUANTIZA-TION SIGNAL | CORRECTION VALUE SIGNAL | PULSE SHAPE |
|---:|---:|---:|---|
| 1.00 | 1.00 | 0.00 | SYMMETRICAL |
| 0.75 | 0.703125 | 0.046875 | ASYMMETRICAL |
| 0.50 | 0.50 | 0.00 | SYMMETRICAL |
| 0.25 | 0.234375 | 0.015625 | ASYMMETRICAL |
| 0.00 | 0.00 | 0.00 | SYMMETRICAL |
| -0.25 | -0.234375 | -0.015625 | ASYMMETRICAL |
| -0.50 | -0.50 | 0.00 | SYMMETRICAL |
| -0.75 | -0.703125 | -0.046875 | ASYMMETRICAL |
| -1.00 | -1.00 | 0.00 | SYMMETRICAL |

PRIOR ART

D/A CONVERSION DEVICE, METHOD, STORAGE MEDIUM, ELECTRONIC MUSICAL INSTRUMENT, AND INFORMATION PROCESSING APPARATUS

CROSS-REFERENCE TO RELATED APPLICATIONS

This application is a Divisional Application of U.S. application Ser. No. 16/477,504, filed Jul. 11, 2019, which is the U.S. National Stage of international application No. PCT/JP2018/002036, which is based upon and claims the benefit of priority from Japanese Patent Application No. 2017-005427, filed Jan. 16, 2017, the entire contents of all of which are incorporated herein by reference.

TECHNICAL FIELD

The present invention relates to a D/A (Digital-to-Analog) conversion device that performs pulse width modulation processing, a D/A conversion method, a storage medium, an electronic musical instrument, and an information processing apparatus.

BACKGROUND ART

A D/A conversion device is conventionally known which uses a delta-sigma modulator (hereinafter referred to as "$\Delta\Sigma$ modulator") that produces a noise shaping effect of shifting quantization noise to a high-pass side so as to improve a S/N (Signal-to-Noise) ratio in an audible band (for example, Patent Document 1).

FIG. 10 is a diagram showing a structural example of a conventional D/A conversion device using a $\Delta\Sigma$ modulator, in which a subtractor 1004 and a $\Sigma$ integrator 1001 perform delta-sigma modulation processing. In addition, a quantizer 1002 quantizes an output value outputted from the $\Sigma$ integrator 1001, and a delay section 1003 delays a quantization value outputted from the quantizer 1002 by an amount equal to a sampling period in oversampling. The subtractor 1004 subtracts a value outputted by the delay section 1003 from a digital input value 1006, and inputs the resultant value of the subtraction in the $\Sigma$ integrator 1001. A symmetrical pulse width modulation section (hereafter referred to as "symmetrical PWM section") 1005 therein performs PWM (Pulse Width Modulation) processing of modulating a quantization value outputted by the quantizer 1002 as a pulse signal having a duty ratio corresponding to the quantization value.

PRIOR ART DOCUMENT

Patent Document

Patent Document 1: JP 2015-185900 A

Here, in the above-described conventional technique, the delta-sigma modulation processing by the subtractor 1004 and the $\Sigma$ integrator 1001 and the PWM processing by the symmetrical PWM section 1005 in FIG. 10 are performed in oversampling periods that are dozens of times or more times greater than sampling periods for an original signal. Here, the values of pulse signals generated by PWM, that is, the voltages are required to be accurate in a time-series sense. Accordingly, for each oversampling period, the pulse shape of a pulse signal generated by the symmetrical PWM section 1005 is required to be symmetrical to the temporally center point of the oversampling period. Otherwise, a desired voltage value is not acquired at an arbitrary point in an oversampling period, by which integrity with respect to the quantizer 1002 is not maintained and intended performance is not achieved. FIG. 11 is a diagram showing an example of a waveform after the PWM processing by the symmetrical PWM section 1005. A period T shown in FIG. 11 is an oversampling period acquired by a sampling period Fs for an original signal being exemplarily divided by 128. In the case of FIG. 11, five values, such as −1.0, −0.5, 0.0, 0.5, and 1.0, may be taken as quantization values outputted by the quantizer 1002 of FIG. 10, and each of them is subjected to pulse width modulation so as to be a pulse signal having one of the five types of duty ratios shown in FIG. 11. For this modulation, the oversampling period T is synchronized with an operation clock CLK having cycles acquired by the oversampling period T being further divided by 8, and the duty ratio of each pulse signal is controlled corresponding to each quantization value. As described above, in the conventional technique, the pulse shape of a pulse signal is required to be symmetrical to the center point T/2 of an oversampling period T, as shown in FIG. 11. That is, the resolution of a pulse signal (the number of quantization) by the conventional PWM is limited to half of the number of clocks of an operation clock CLK within an oversampling period T. In the example shown in FIG. 11, the number of clocks (the number of cycles) of the operation clock CLK within the oversampling period T is eight and therefore quantization values that can be modulated are the five values.

The resolution, that is, the number of quantization of a pulse signal by PWM has a direct effect on the dynamic range of a D/A conversion device or the like. Therefore, when the dynamic range is required to be increased, the frequency of the operation clock is required to be increased. However, there is a problem in that, in order to increase the dynamic range, a PLL (Phased Lock Loop) circuit supporting a higher frequency is required, which increases power consumption.

In a case where this type of D/A conversion device is used for the output of an analog musical sound signal of an electronic musical instrument, increasing the cost and power consumption of a D/A conversion device has a direct effect on the performance of the electronic musical instrument, and therefore there occurs a problem.

An object of the present invention is to provide a device by which a dynamic range can be increased without the frequency of an operation clock being increased and, when the dynamic range is not to be changed, the frequency of the operation clock is decreased so as to reduce power consumption.

SUMMARY OF INVENTION

In accordance with one aspect of the present invention, there is provided a digital-to-analog conversion device which performs: integration processing for integrating a difference between an input signal and a first return signal generated based on the input signal, and outputting an integration result; first quantization processing for quantizing the integration result outputted by the integration processing, and outputting a first quantization signal; first return signal output processing for outputting the first return signal by adding to the first quantization signal a correction value delay signal acquired by a correction value signal outputted based on the integration result outputted by the integration processing being delayed; and output processing for outputting output signals including a signal whose pulse width is asymmetrical to center of a processing period, based on the first quantization signal acquired by the quantization of the first quantization processing, wherein the correction value signal includes a signal indicating a correction value for correcting a difference between a center of the pulse width asymmetrical to the center of the processing period and the center of the processing period.

BRIEF DESCRIPTION OF DRAWINGS

The present invention can be more clearly understood by the detailed description below being considered together with the following drawings.

FIG. 6 is a diagram showing examples of a relation between a target quantization value, a first quantization signal, a correction value signal, and a pulse shape;

DESCRIPTION OF EMBODIMENTS

Figure 2:
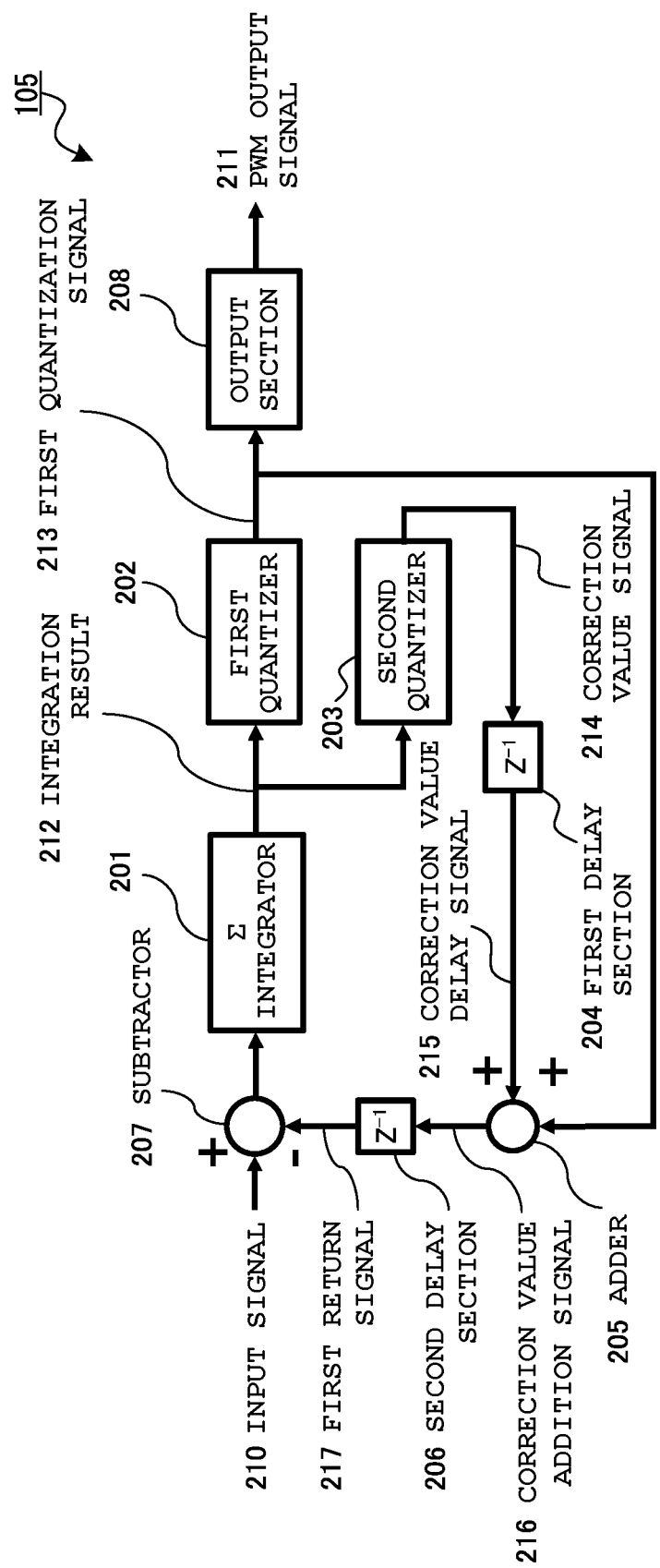
FIG. 2 is a block diagram showing a structural example of an embodiment of a D/A conversion device.

Embodiments of the present invention will hereinafter be described with reference to the drawings. In the present embodiment, in the case of nine-stage quantization, PWM processing by a D/A conversion device or an information processing apparatus including the D/A conversion device outputs PWM signals (five stages where target quantization values indicate −1.0, −0.5, 0.0, 0.5, and 1.0, respectively) having pulse shapes symmetrical to the center (T/2) of an oversampling period (T), and PWM signals (four stages where target quantization values indicate −0.75, −0.25, 0.25, and 0.75, respectively) having pulse shapes asymmetrical to the center of this processing period. That is, for each processing period, an output section 208 to which a first quantization signal has been outputted from a first quantizer 202 outputs a PWM output signal having a duty ratio corresponding to the inputted first quantization signal, as shown in FIG. 2. This PWM output signal has a pulse shape symmetrical to the center of the processing period or a pulse shape asymmetrical to the center of the processing period.

In this processing, a second quantizer 203 outputs a correction value signal 214 for correcting a difference between the center point of the processing period and the center point of the duty (ON time) of the PWM, based on an integration result 212 outputted by a integrator 201. For example, when a PWM output signal 211 is symmetrical (its pulse shape is symmetrical) to the center of a processing period and a target quantization value is 1.00, a correction value signal 214 indicating a value of 0 is outputted, as shown in FIG. 6. Also, for example, when a PWM output signal 211 is asymmetrical (its pulse shape is asymmetrical) to the center of a processing period and a target quantization value is 0.75, a correction value signal 214 indicating a value of 0.046875 is outputted.

By the above-described processing where PWM signals each having a pulse shape symmetrical to the center of a processing period and PWM signals each having a pulse shape asymmetrical to the center of a processing period are outputted, quantization stages in a processing period can be increased. As a result of this configuration, a device is actualized by which a dynamic range can be increased without the frequency of an operation clock being increased and, when the dynamic range is not to be changed, the frequency of the operation clock is decreased so as to reduce power consumption.

Figure 1:
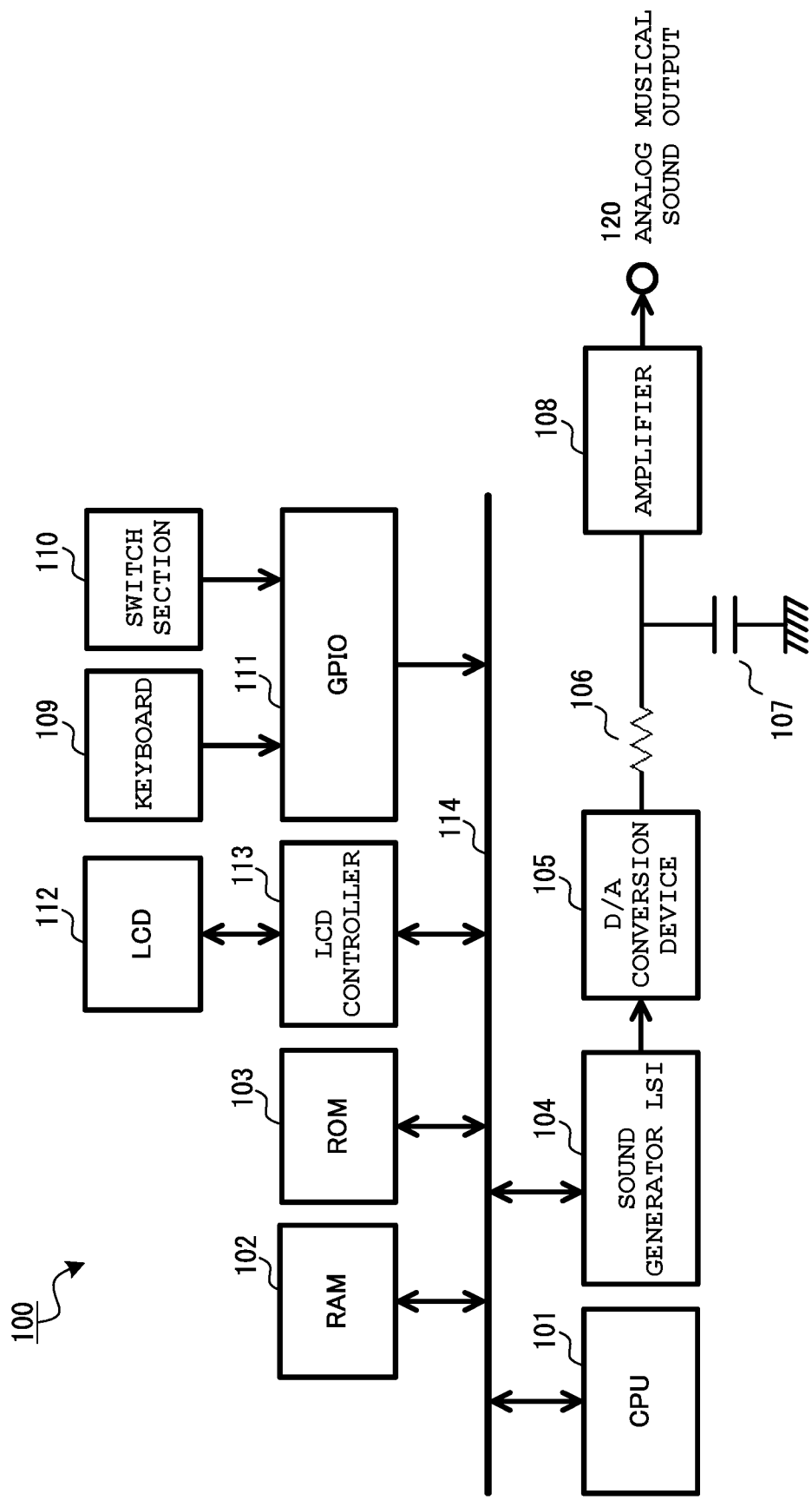
FIG. 1 is a block diagram showing an example of the hardware structure of an embodiment of a control system for an electronic keyboard instrument.

FIG. 1 is a block diagram showing an example of the hardware structure of an embodiment of a control system 100 for an electronic keyboard instrument that is an embodiment of the present invention. In FIG. 1, the control system 100 for the electronic keyboard instrument has a structure where a CPU (Central Processing Unit) 101, a RAM (Random Access Memory) 102, a ROM (Read-Only Memory) 103, a sound generator LSI (Large-Scale Integration) 104, a GPIO (General Purpose Input/Output) 11 where a keyboard 109 and a switch section 110 are connected, an LCD (Liquid Crystal Display) controller 113 where an LCD 112 is connected, and the like are connected to a system bath 114. A digital musical sound waveform value outputted from the sound generator LSI 104 is converted into an analog musical sound waveform signal by a filter section constituted by a D/A conversion device 105, a resister 106, and a capacitor 107, amplified by an amplifier 108, and then outputted from a speaker or an output terminal not shown.

The CPU 101 executes a control program stored in the ROM 103 while using the RAM 102 as a work memory, and thereby controls the entire electronic keyboard instrument. The ROM 103 stores various fixed data in addition to the control program.

The sound generator LSI 104 reads out a waveform from the waveform ROM 103, and outputs it to the D/A conversion device 105. This sound generator LSI 104 is capable of simultaneously generating a maximum of 256 voices.

The GPIO 111 continually scans the operation statuses of the keyboard 109 and the switch section 110, and informs the CPU 101 of a status change by generating an interrupt to the CPU 101.

The LCD controller 113 is an IC (integrated circuit) for controlling the LCD 112.

FIG. 2 is a block diagram showing a structural example of an embodiment of the D/A conversion device 105 shown in FIG. 1.

A subtractor 207 and the above-described $\Sigma$ integrator 201 perform $\Delta\Sigma$ (delta-sigma) modulation processing.

The first quantizer 202 and the second quantizer 203 individually quantize an integration result 212 outputted by the $\Sigma$ integrator 201 based on the value of the integration result 212, and output a first quantization signal 213 and a correction value signal 214.

A first delay section 204 in FIG. 2 delays the correction value signal 214 outputted by the second quantizer 203 by an amount of time equal to an oversampling period, and outputs a correction value delay signal 215.

An adder 205 in FIG. 2 adds the first quantization signal 213 outputted by the first quantizer 202 to the correction value delay signal 215 outputted by the first delay section 204, and outputs a correction value addition signal 216.

A second delay section 206 in FIG. 2 delays the correction value addition signal 216 outputted by the adder 205 by an amount of time equal to the oversampling period, and outputs a first return signal 217.

The subtractor 207 subtracts the first return signal 217 outputted by the second delay section 206 from a digital sound waveform value 210 outputted by the sound generator LSI 104 in FIG. 1, and inputs a value acquired by this subtraction into the Σ integrator 201.

The output section 208 generates, for each oversampling period, a pulse signal having a duty ratio corresponding to a first quantization signal 213 outputted by the first quantizer 202 and a pulse shape that is asymmetrical to the center of the oversampling period and corresponding to the first quantization signal 213, and thereby outputs a PWM output signal 211.

This PWM output signal 211 is smoothed by a low pass filter (output element) constituted by the resister 106 and the capacitor 107 in FIG. 1, and outputted to the amplifier 108 in FIG. 1 as an analog sound waveform signal.

Figure 3:
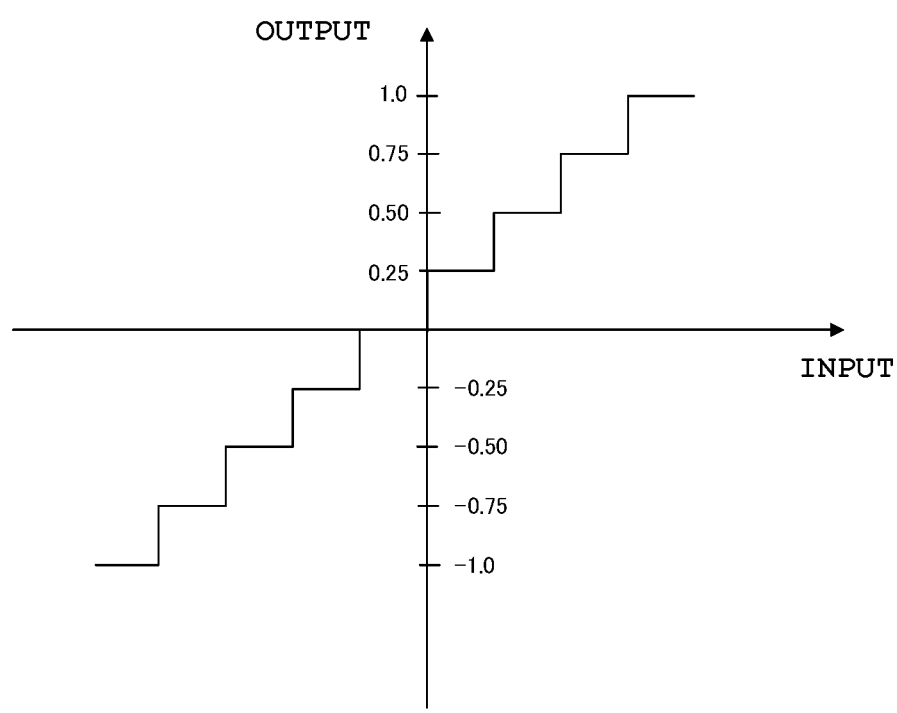
FIG. 3 is a diagram of an example showing target quantization levels of the D/A conversion device in the embodiment.

FIG. 3 is a diagram of an example showing target quantization levels of the D/A conversion device in FIG. 2. In the present embodiment, output values from the Σ integrator 201 are quantized to nine values, which are −1.0, −0.75, −0.50, −0.25, 0.00, 0.25, 0.50, 0.75, and 1.0.

Then, pulse signals corresponding to these quantization values are generated. In the present embodiment, the output section 208 generates pulse signals each having a duty ratio corresponding to a quantization value and a pulse shape asymmetrical to the center of an oversampling period.

Figure 4:
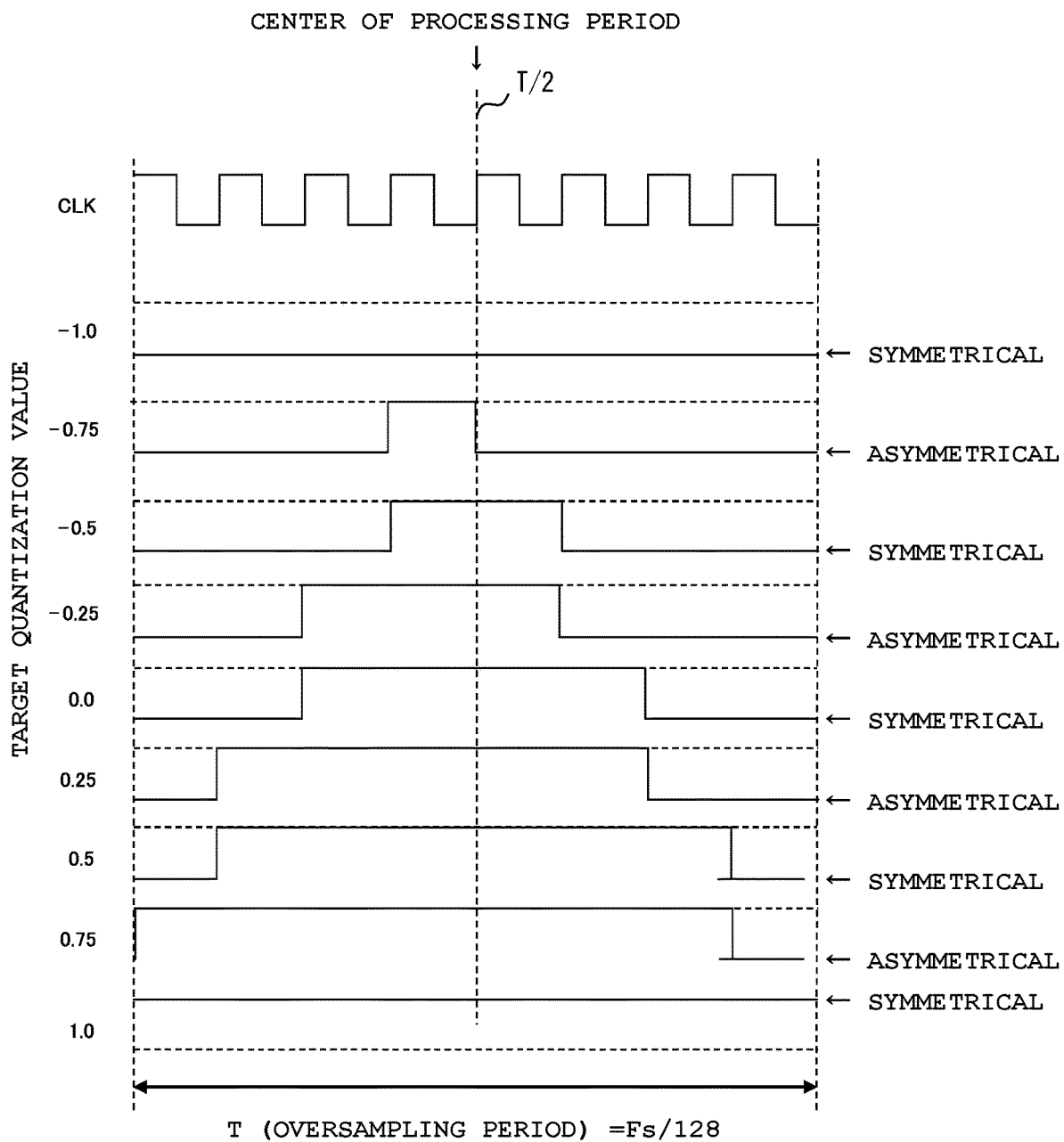
FIG. 4 is a diagram showing examples of a waveform after PWM processing by a symmetrical PWM section in the embodiment.

FIG. 4 is a diagram showing examples of a waveform after PWM processing in the output section 208. As in the case of the conventional technique shown in FIG. 11, a period T shown in FIG. 4 is an oversampling period acquired by a sampling period Fs for an original signal being exemplarily divided by 128. In the case of FIG. 4, the above-described nine values are possible target quantization values, and each of them is subjected to pulse width modulation so as to be a pulse signal having one of the nine types of duty ratios shown in FIG. 4. For this modulation, the oversampling period T is synchronized with an operation clock CLK having cycles acquired by the oversampling period T being further divided by 8, and the duty ratio of each pulse signal is controlled corresponding to each quantization value, as in the case of the conventional technique shown in FIG. 11.

Figure 11:
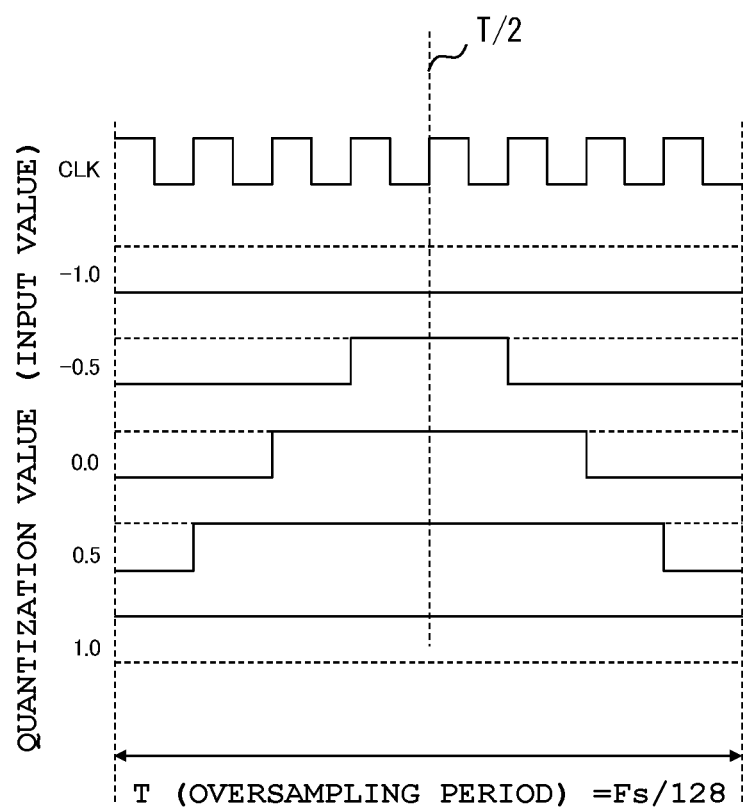
FIG. 11 is a diagram showing examples of a waveform after PWM processing by a symmetrical PWM section.

Unlike the conventional technique shown in FIG. 11, in the present embodiment, an asymmetrical shape is adopted as the pulse shape of a pulse signal in addition to a shape symmetrical to the center point T/2 of an oversampling period T, as shown in FIG. 4.

This modulation control enables modulation stages to be "9" stages, which is equivalent to "8" operation clock cycles for PWM in an oversampling period+"1". Accordingly, even with the same operation clock CLK as that of FIG. 11, the nine stages shown in FIG. 3 can be achieved as quantization stages in an oversampling period. That is, as compared to the case of FIG. 11 whose modulation stages and quantization stages are five stages, substantially doubled quantization can be performed in the present embodiment.

This indicates that, in the present embodiment, a dynamic range can be increased to about double without the frequency of an operation clock being increased and, when the dynamic range is not to be changed, the frequency of the operation clock can be decreased by about half so as to reduce power consumption, as compared to the conventional technique.

Figure 5:
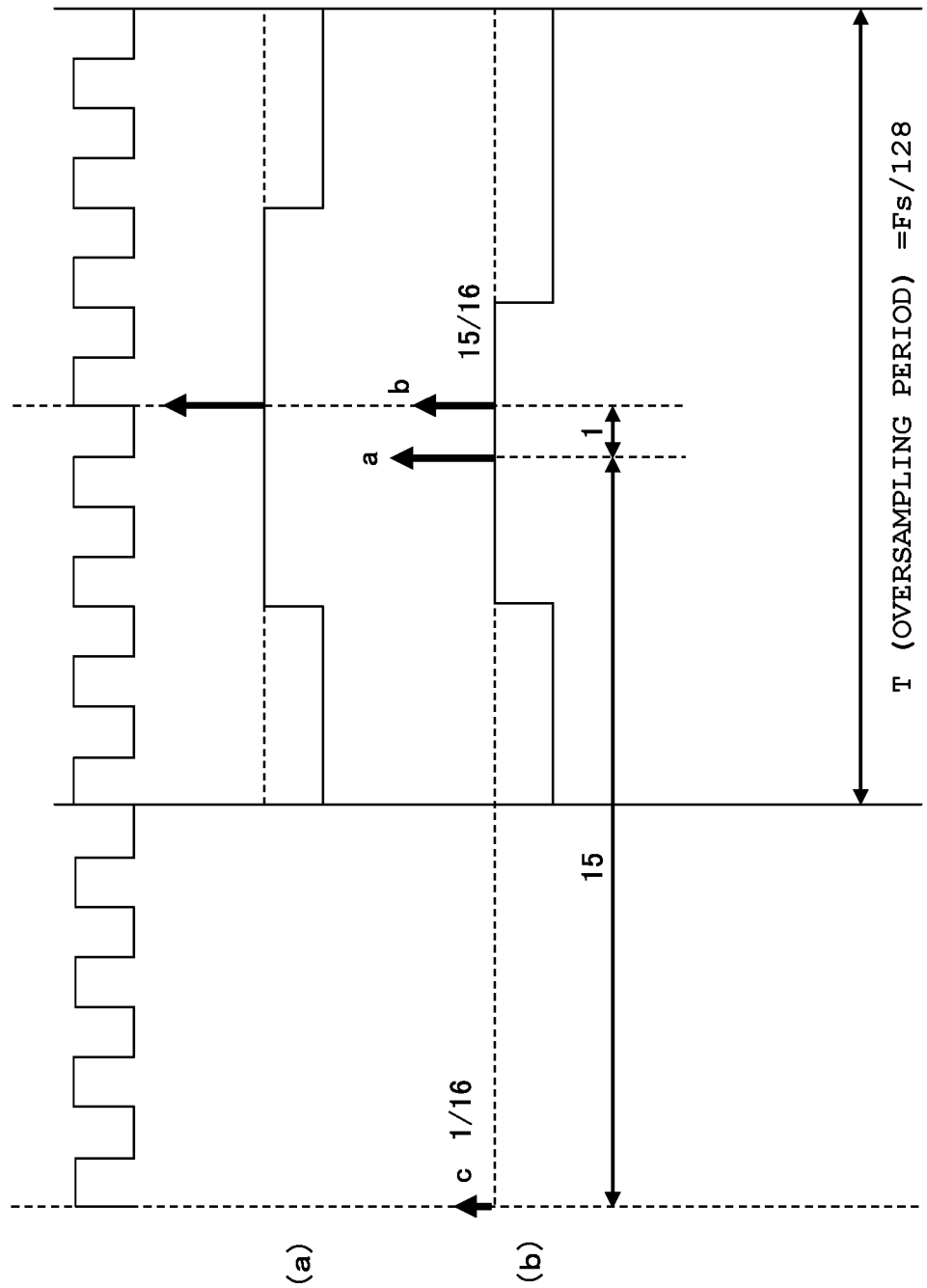
FIG. 5 is a diagram for describing voltage division control for asymmetrical PWM waveforms.

FIG. 5 is a diagram for describing voltage division control for asymmetrical PWM waveforms. In the case of a symmetrical PWM waveform shown in (a) of FIG. 5, the center point of an averaged voltage coincides with the temporally center point b of an oversampling period T. In normal situations, in any of the cases of duty ratios in PWM, true quantization values are not expressed unless the center point of the averaged voltage of each waveform coincides with the center point of an oversampling period. However, in the case of an asymmetrical PWM waveform shown in (b) of FIG. 5, three cycles of an operation clock CLK corresponds to high-level voltage sections. That is, point "a" is the center point of the averaged voltage of the asymmetrical PWM waveform in (b) of FIG. 5, which does not coincide with the center point b of the oversampling period T.

Here, when a voltage value at point "a" is vectorially decomposed, it can be considered to be a composition of a voltage value at point "b" and a voltage value at point "c". Point "b" represents the center point of the current oversampling period and point "c" represents the center point of the next oversampling period. That is, the asymmetrical PWM waveform can be considered to be equivalent to the voltage value divided into that at the center point "b" of the current oversampling period and that at the center point "c" of the next oversampling period.

As such, by the process where an asymmetrical PWM waveform is vectorially decomposed for two oversampling periods and a voltage value corresponding to point "c" is added to a value occurred in the next oversampling period, the accuracy of quantization can be improved.

The structural example of the D/A conversion device 105 shown in FIG. 2 actualizes the above-described voltage division control. The first quantizer 202 generates the first quantization signal 213 corresponding to point "b" of FIG. 5, and the second quantizer 203 generates the correction value signal 214 corresponding to point "c" of FIG. 5. The correction value signal 214 is delayed by one oversampling period by the first delay section 204, and added to the first quantization signal 213 in the adder 205. The correction value addition signal 216 acquired thereby is further delayed by one oversampling period by the second delay section so as to generate the first return signal 217. The first return signal 217 is subtracted from the input signal 210 inputted in the next oversampling period, and the resultant value acquired thereby is inputted into the integrator 201. As a result, the voltage division control described using FIG. 5 is actualized.

By the above-described control operation, a positional difference of the voltage center of a PWM waveform by it being asymmetrical is correctly reflected in the integrator 201, and the asymmetrical PWM waveform can be used without the frequency of the operation clock CLK being increased. As a result, the dynamic range of the D/A conversion device 105 can be expanded.

FIG. 6 is a diagram showing examples of a relation between a target quantization value with respect to an output value of the integrator 201, the value of a first quantization signal 213 that is outputted by the first quantizer 202, the value of a correction value signal 214 that is outputted by the second quantizer 203, the pulse shape of a pulse signal that is generated by the output section 208, in nine-stage quantization.

When target quantization values are −1.00, −0.50, 0.00, 0.50, and 1.00, the pulse shapes of PWM waveforms are set to be symmetrical to the center point of an oversampling period, the values of first quantization signals 213 to be outputted by the first quantizer 202 are set to be the same as the target quantization values, and the values of correction value signals 214 to be outputted by the second quantizer 203 are set to be zero, as shown in FIG. 4.

When target quantization values are −0.75, −0.25, 0.25, and 0.75, the pulse shapes of PWM waveforms are set to be asymmetrical to the center point of an oversampling period, the value of each first quantization signal 213 to be outputted by the quantizer 202 and the value of each correction value signal 214 to be outputted by the second quantizer 203 are set to have a ratio based on a time relation between the voltage center point (which corresponds to point "a" of FIG. 4) of each waveform and the center point (which corresponds to point "b" of FIG. 4) of the oversampling period, as shown in FIG. 4. In this case, values acquired by each first quantization signal 213 being added to the corresponding correction value signal 214 are equal to the target quantization values.

Figure 7:
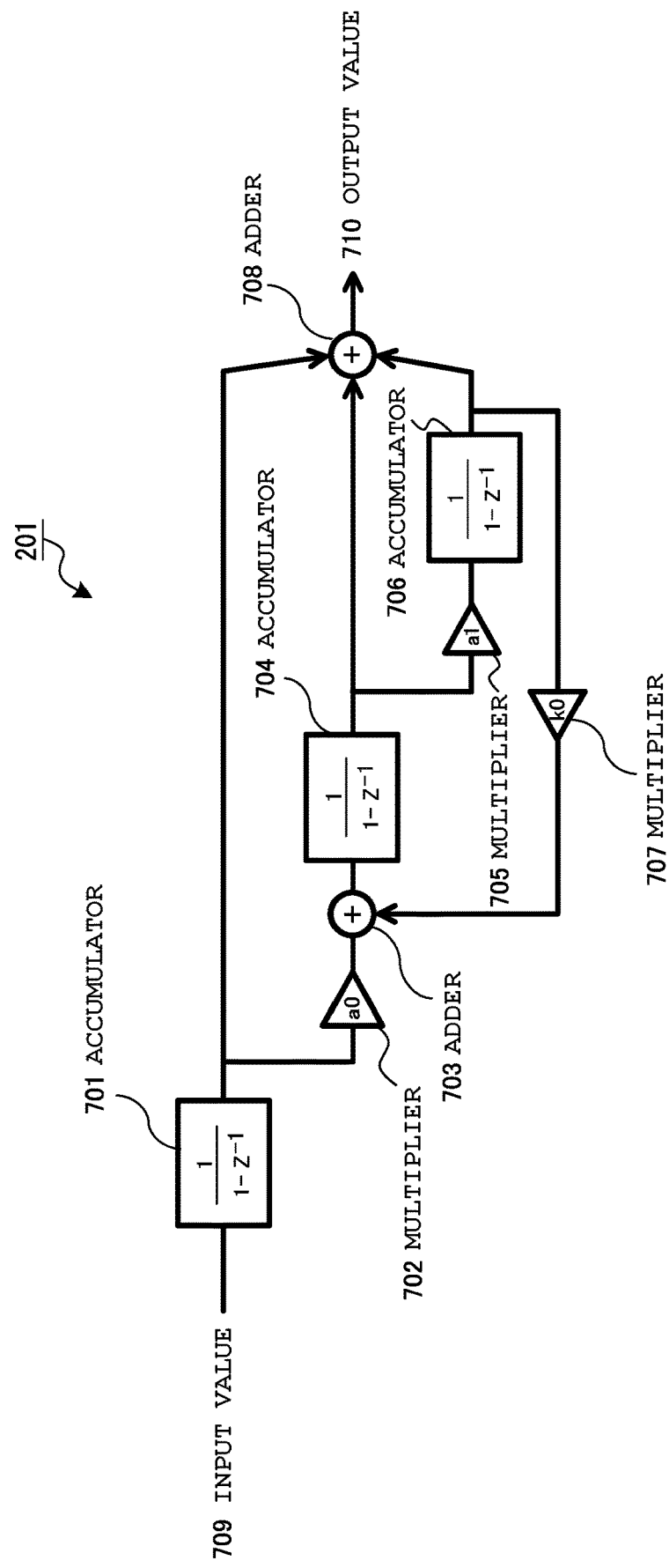
FIG. 7 is a block diagram showing a structural example of an embodiment of a integrator.

FIG. 7 is a block diagram showing a structural example of the embodiment of the Σ integrator shown in FIG. 2. In this structural example, a third-order noise shaping operation is actualized by three accumulators 701, 704, and 706 being connected and multiplication by multiplication coefficients a0 and a1 being performed in a multiplier 702 and a multiplier 707 in sequence.

In FIG. 7, an input value 709 (an output value from the subtractor 207 in FIG. 2) is inputted into the accumulator 701, and an output value from the accumulator 701 is multiplied by the multiplication coefficient a0 by the multiplier 702 and then inputted into the accumulator 704 via an adder 703. An output value from the accumulator 704 is multiplied by the multiplication coefficient a1 by the multiplier 705, and then inputted into the accumulator 706. An output value from the accumulator 706 is multiplied by the multiplication coefficient k0 by the multiplier 707, and then added to an output value from the multiplier 702 in the adder 703. The value acquired by this addition is fed back to the accumulator 704. Each output value from the accumulators 701, 704, and 706 is added in an adder 708, and the value acquired by this addition is outputted as an output value 710.

By a ΔΣ modulation section constituted by the Σ integrator 201 having the above-described configuration and the subtractor 207 shown in FIG. 2, the frequency characteristic of noise can be put outside an audible range.

Figure 8:
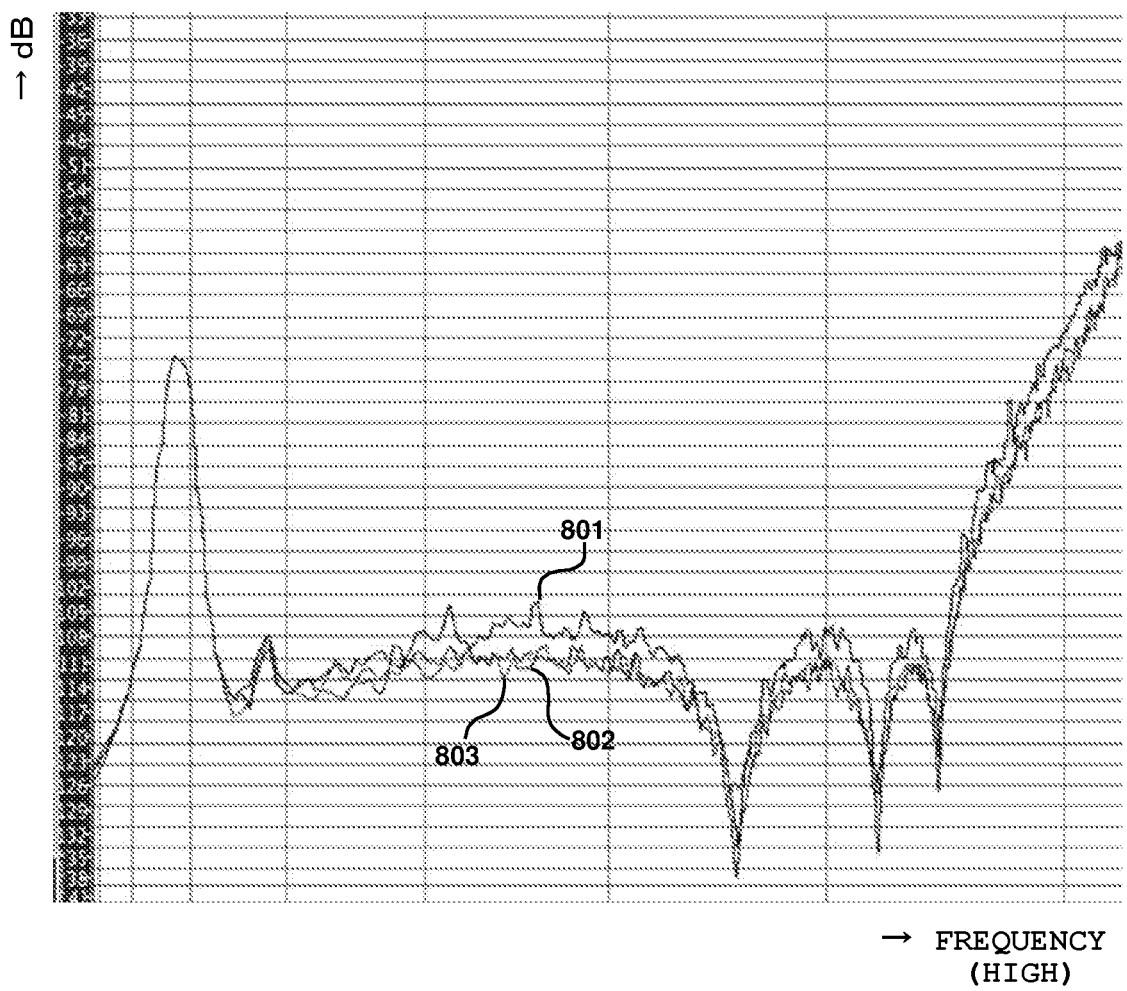
FIG. 8 is a diagram comparing the noise shaping characteristic of the embodiment with that of a conventional technique.

FIG. 8 is a diagram comparing the noise shaping characteristic of the embodiment with that of the conventional technique. Reference numeral 801 of FIG. 8 denotes a noise shaping characteristic in three-stage quantization using symmetrical PWM by the conventional technique. Reference numeral 802 of FIG. 8 denotes a noise shaping characteristic in five-stage quantization using symmetrical PWM and asymmetrical PWM by the present embodiment with an operation clock having the same frequency as that of reference numeral 801. Reference numeral 803 of FIG. 8 denotes a noise shaping characteristic in five-stage quantization using symmetrical PWM by the conventional technique (where the frequency of the operation clock has been increased to be more than that of reference numeral 801).

As can be seen from the comparison diagram, when the quantization of the conventional technique and that of the present embodiment at the same stage are compared, the noise shaping characteristic 802 of the present embodiment is substantially the same as the noise shaping characteristic 803 of the conventional technique.

Figure 9:
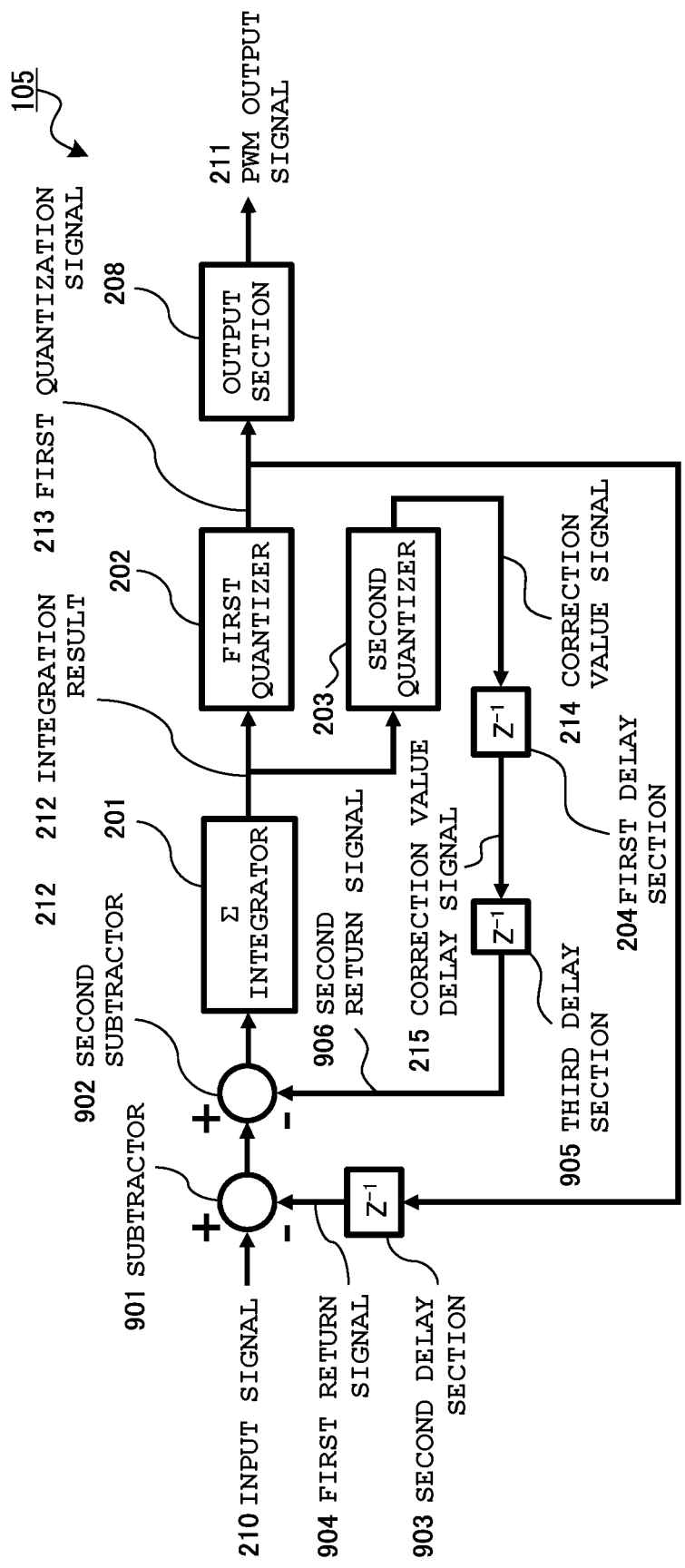
FIG. 9 is a block diagram showing a structural example of another embodiment of the D/A conversion device.
Figure 10:
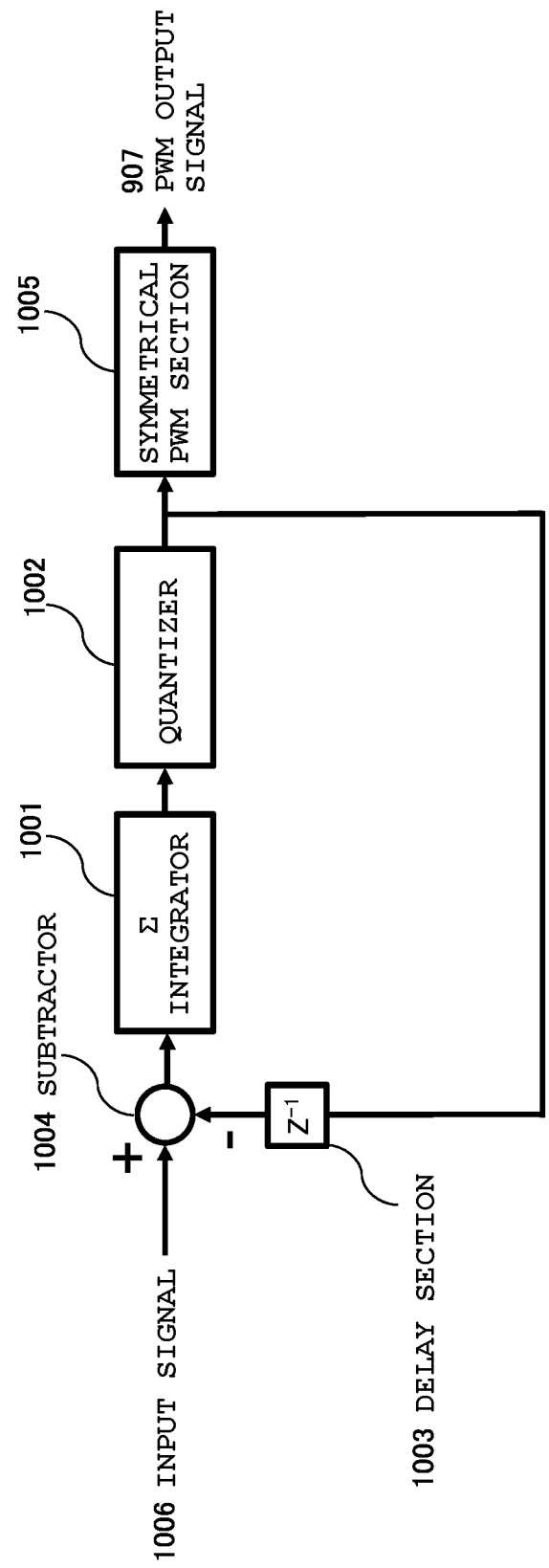
FIG. 10 is a diagram showing a structural example of a conventional D/A conversion device using a $\Delta\Sigma$ modulator.

FIG. 9 is a block diagram showing a structural example of another embodiment of the D/A conversion device shown in FIG. 1. Note that, in FIG. 9, sections having the same reference numerals as those of the above-described embodiment shown in FIG. 2 perform the same operations as those of FIG. 2. In the embodiment shown in FIG. 2, the correction value delay signal 215, which is acquired by the correction value signal 214 being delayed by the first delay section 204, is added to the first quantization signal 213 by the adder 205, delayed by the second delay section 206, and returned to the input side from the subtractor 207 as part of the first return signal 217. However, in the embodiment shown in FIG. 9, the first quantization signal 213 and the correction value signal 214 are independently returned to the input side.

More specifically, the first quantization signal 213 is delayed by a second delay section 903, and then returned to the input side from a subtractor 901 as a first return signal 904. On the other hand, the correction value delay signal 215, which is acquired by the correction value signal 214 being delayed by the first delay section 204, is further delayed by a third delay section 905, and then returned to the input side from a subtractor 902 as a second return signal 906.

With this embodiment, a device can be actualized by which a dynamic range can be increased without the frequency of an operation clock being increased and, when the dynamic range is not to be changed, the frequency of the operation clock is decreased so as to reduce power consumption.

In the above-described embodiments, the example has been shown in which the stages of target quantization are nine stages. However, in actual D/A conversion devices in electric musical instruments and the like, quantization with more stages is performed. The above-described embodiments can also be applied to such quantization with multi stages.

Also, the configuration of the Σ integrator 201 shown in FIG. 2 and used for the above-described embodiments is not limited to that shown in FIG. 7, and other configurations can be adopted.

Moreover, in the above-described embodiments, the example has been described in which the present invention is applied in a D/A conversion device. However, the present invention can be applied in cases where asymmetrical PWM is performed on target quantization values. For example, the present invention can be applied in an A/D (Analogue to Digital) conversion device and the like.

While the present invention has been described with reference to the preferred embodiments, it is intended that the invention be not limited by any of the details of the description therein but includes all the embodiments which fall within the scope of the appended claims.

The invention claimed is:

1. A digital-to-analog conversion device comprising:
   circuitry including:
   an integrator that is configured to perform integration processing for integrating a difference between an input signal and a first return signal and a second return signal generated based on the input signal, to thereby generate an integration result;
   a first quantizer that is configured to perform first quantization processing for quantizing the integration result generated by the integrator, to thereby generate a first quantization signal; and
   an output section that is configured to perform output processing for outputting output signals including a Pulse Width Modulation (PWM) signal whose pulse width is asymmetrical to a center of a processing period, based on the first quantization signal generated by the quantization of the first quantization processing, wherein the first return signal delays the first quantization signal, wherein the second return signal delays a correction value signal outputted based on the integration result generated by the integrator, and wherein the correction value signal includes a signal indicating a correction value for correcting a difference between (i) a center of the pulse width asymmetrical to the center of the processing period and (ii) the center of the processing period.

2. A digital-to-analog conversion method for a digital-to-analog conversion device comprising circuitry including an integrator, a first quantizer, and an output section, the method comprising:

performing, by the integrator, integration processing for integrating a difference between an input signal and a first return signal and a second return signal generated based on the input signal, to thereby generate an integration result;

performing, by the first quantizer, first quantization processing for quantizing the integration result generated by the integrator, to thereby generate a first quantization signal; and performing, by the output section, output processing for outputting output signals including a Pulse Width Modulation (PWM) signal whose pulse width is asymmetrical to a center of a processing period, based on a first quantization signal generated by the quantization of the first quantization processing, wherein the first return signal delays the first quantization signal, wherein the second return signal delays a correction value signal outputted based on the integration result generated by the integrator, and wherein the correction value signal includes a signal indicating a correction value for correcting a difference between (i) a center of the pulse width asymmetrical to the center of the processing period and (ii) the center of the processing period.

3. The digital-to-analog conversion device according to claim 1, wherein the pulse width includes a first period that comes before a timing at the center of the processing period and a second period that comes after the timing at the center of the processing period, and wherein the first period and the second period have different time lengths.

4. An electronic musical instrument comprising:

the digital-to-analog conversion device according to claim 1;

a keyboard; and a sound emission section which emits a musical sound subjected to digital-to-analog conversion based on an output from the digital-to-analog conversion device.

5. An information processing apparatus comprising:

the digital-to-analog conversion device according to claim 1; and a sound emission section which emits a musical sound subjected to digital-to-analog conversion based on an output from the digital-to-analog conversion device.

6. The digital-to-analog conversion device according to claim 1, the circuitry further including:

a first subtractor that is configured to perform first subtraction processing for obtaining the difference between the input signal and the first return signal, to thereby generate a first subtraction processing result.

7. The digital-to-analog conversion device according to claim 6, the circuitry further including:

a second subtractor that is configured to perform second subtraction processing for obtaining a difference between the first subtraction processing result and the second return signal, to thereby generate a second subtraction processing result.

8. The digital-to-analog conversion device according to claim 7, the circuitry further including:

a first delay section that is configured to perform first delay processing for generating a correction value delay signal by delaying the correction value signal, and outputting the correction value delay signal; and a second delay section that is configured to perform second delay processing for generating the first return signal by delaying the first quantization signal, and outputting the first return signal to the first subtractor.

9. The digital-to-analog conversion device according to claim 8, the circuitry further including:

a third delay section that is configured to perform third delay processing for generating the second return signal by delaying the correction value delay signal output by the first delay section.

* * * * *